United States Patent [19]
Harvey et al.

[11] Patent Number: 5,772,500
[45] Date of Patent: Jun. 30, 1998

[54] COMPACT VENTILATION UNIT FOR ELECTRONIC APPARATUS

[75] Inventors: Robert T. Harvey; Tina M. Reintjes, both of Wichita, Kans.

[73] Assignee: Symbios, Inc., Fort Collins, Colo.

[21] Appl. No.: 770,890

[22] Filed: Dec. 20, 1996

[51] Int. Cl.$^6$ ...................................................... H05K 7/20
[52] U.S. Cl. ........................ 454/184; 415/60; 415/182.1; 415/206
[58] Field of Search ............................ 454/184; 361/695, 361/697; 415/60, 182.1, 206

[56] References Cited

U.S. PATENT DOCUMENTS

| | | |
|---|---|---|
| 4,502,100 | 2/1985 | Greenspan et al. . |
| 4,751,872 | 6/1988 | Lawson, Jr. . |
| 4,756,473 | 7/1988 | Takemae et al. . |
| 4,767,262 | 8/1988 | Simon . |
| 4,899,254 | 2/1990 | Ferchau et al. . |
| 5,163,870 | 11/1992 | Cooper .................................... 454/184 |
| 5,193,050 | 3/1993 | Dimmick et al. . |
| 5,247,427 | 9/1993 | Driscoll et al. . |
| 5,285,347 | 2/1994 | Fox et al. . |
| 5,339,214 | 8/1994 | Nelson .................................... 361/695 |
| 5,398,159 | 3/1995 | Andersson et al. ...................... 361/695 |
| 5,438,226 | 8/1995 | Kuchta .................................... 307/125 |
| 5,484,012 | 1/1996 | Hiratsuka et al. ....................... 454/184 |
| 5,490,723 | 2/1996 | Driscoll et al. ..................... 312/334.28 |
| 5,505,533 | 4/1996 | Kamersquad et al. .................. 312/236 |
| 5,540,548 | 7/1996 | Eberhardt et al. .................. 454/184 X |
| 5,562,410 | 10/1996 | Sachs et al. ........................ 454/184 X |
| 5,572,403 | 11/1996 | Mills ...................................... 361/695 |

FOREIGN PATENT DOCUMENTS

| | | | |
|---|---|---|---|
| 24 16 103 | 10/1975 | Germany ............................... 361/695 |
| 3-85797 | 4/1991 | Japan ..................................... 361/695 |
| 1101588 | 7/1984 | U.S.S.R. .................................. 415/60 |
| 413351 | 8/1910 | United Kingdom ..................... 415/60 |

OTHER PUBLICATIONS

"Brushless DC SanAce"; Sanyo Denki Co., Ltd.; Brushless DC Scirocco Ace; p. 29.

*Primary Examiner*—Harold Joyce
*Attorney, Agent, or Firm*—Wayne P. Bailey; Jean M. Macheledt

[57] ABSTRACT

A ventilation unit for operative arrangement within an electronic apparatus, the unit including an exterior side having a first exhaust port separated from a second exhaust port, an adjacent interior side having first and second incoming passageways, and a first and second powered air mover; one powered air mover can be located closer to the exterior side than the other air mover. The first powered air mover can be in communication with the first incoming passageway and the first exhaust port, and separated from the second powered air mover by use of a baffle extending generally from the exterior side around and between the two air movers. Additional powered air movers can be accommodated. Also, a ventilation unit including an exterior side having first and second exhaust ports, an adjacent interior side having first and second incoming passageways, and a first and second powered air mover; wherein the first powered air mover in communication with both the first incoming passageway and the first exhaust port, yet separated from the second powered air mover which is in communication with both the second incoming passageway and second exhaust port. A method of venting thermal energy generated within an electronic apparatus through an exterior side of a ventilation unit operating within the apparatus. This method comprises drawing air in through a first incoming passageway of an interior side of the unit and out a first exhaust port of the exterior side, separately from drawing air in through a second incoming passageway of the interior side and out a second exhaust port of the exterior side; the first incoming passageway can be located closer to the exterior side than the second incoming passageway.

27 Claims, 6 Drawing Sheets

COMPACT VENTILATION UNIT FOR ELECTRONIC APPARATUS

BACKGROUND OF THE INVENTION

In general, the present invention relates to cooling systems for electronic circuitry, and more particularly, to a new compact ventilation unit for operative arrangement within a computerized apparatus having at least two powered air movers, one located closer to an exterior side of the unit than the other(s).

It is well known that electronic equipment, and specifically computerized devices, generate thermal energy when powered-up and operating. To prevent component failure and early degradation due to overheating, heat must be vented from within computerized devices. As the overall size of computerized devices continues to decrease with new models, the speed and the size of memory and fixed storage of these devices has dramatically increased. These newer models often have many more electronic components and printed circuit boards (upon which components are mounted), compacted into a smaller chassis. Regulating the temperature of many electronic components within a smaller chassis has become a challenge. There is simply too little space available in newer model computerized devices to accommodate known ventilation systems. Particularly, a smaller chassis has less available "real estate" on its external back panel where connectors, peripheral connection ports, ventilation exhaust ports, and fasteners compete for space.

Currently available ventilation systems for computers have side by side fans mounted so that their axes of rotation extend perpendicular to the chassis outer back wall drawing hot air from the inside of the computer through the fan blades and directly out of the chassis. See, for example, the ventilation systems described in U.S. Pat. Nos.: 5,339,214; 4,751,872; 4,767,262; and 5,193,050. Since the fans used in such known ventilation systems must be sized to fit within available back panel real estate limitations, the volume of warm air removed by known ventilation systems is necessarily limited. As one can see, increasing the diameter of the fans in known systems increases the ventilation system's size greatly, requiring an equally large increase in the back panel space needed to install the more-powerful systems.

None of the known ventilation systems, as designed, allow for increased air removal without a corresponding substantial increase in the chassis space required for installing the system. For example, to increase the volume of warm air removed by the side-by-side ventilation system in U.S. Pat. No. 4,767,262, more side-by-side fans had to be added with their axes of rotation also extending perpendicular to the chassis outer back wall. In most computerized devices, chassis real estate is simply not available to accommodate a more powerful ventilation system having such large external exhaust port space requirements. Without reasonable solutions at hand for adequately ventilating the interior space of a complex electronic instrument, an electronic designer can be severely limited in component and printed circuit board design alternatives.

The new compact ventilation unit, described herein, is designed for operation within a wide range of electronic apparatuses that require removal of unwanted thermal energy generated by electronic components during use. This innovative unit has the capacity to remove a greater amount of thermal energy to maintain desired temperatures within a computerized device, without requiring a substantial increase in the size of its side containing airflow exhaust ports. The available exterior computer housing real estate needed to install the present invention is, therefore, minimized. Furthermore, not only can this new unit be installed and removed with relative ease, it can reach further into the interior of an electronic device to expel heat generated within, out an exterior (usually, located on the back) housing panel. The new unit can accommodate suitable couplings for hot plugging into an electronic apparatus as necessary.

Unlike the ventilation systems currently available comprised of propeller fans having axes of rotation extending perpendicular to the chassis back wall, the new unit was developed to utilize chassis wall space more efficiently. As will be explained, a third and fourth fan can be added to the new unit described herein, in the spirit of this design goal.

SUMMARY OF THE INVENTION

It is a primary object of this invention to provide a ventilation unit for operative arrangement within an electronic apparatus that has at least two powered air movers, each of which can draw air, or some other gas, in through separate incoming passageways of an interior side of the unit and out respective exhaust ports of an exterior side of the unit. It is also an object of this invention that such a ventilation unit have an interior side comprising the exhaust ports, that can be sized to fit relatively smaller electronic apparatus chassis back panels. It is also an object of this invention to provide a method of venting thermal energy generated within an electronic apparatus by drawing air, or some other gas, in through at least two separated incoming passageways and then out respectively connected exhaust ports.

The advantages of providing both the compact new ventilation unit and the new method of venting thermal energy within an electronic apparatus, as described herein, are as follows: (a) Thermal energy, or heat, generated by electronic components and assemblies can be expelled from an electronic apparatus chassis using this new unit with its two powered air movers, without requiring a substantial increase in size of the chassis; (b) It is desirable to have at least two powered air movers available for use—one for backup in the event the other air mover fails; (c) Sufficiently maintaining the internal temperature of an electronic apparatus aids in reducing electronic component degradation, thus extending component life; (d) Unit design flexibility—additional powered air movers can be added to expel a greater amount of heat or expel heat at a faster rate without requiring a substantial increase in size of the unit's exterior side containing exhaust ports; (e) Electronic apparatus design flexibility—a ventilation unit designed to take up less chassis back panel real estate, allows design engineers greater design flexibility to accommodate additional chassis connectors, fasteners, ports, etc. into the design of an electronic apparatus; (f) Unit design simplicity—reducing the number and size of components required to build a ventilation can substantially reduce its overall fabrication cost; and (g) Versatility—the new unit can be sized appropriately to fit within a wide range of electronic apparatus chassis sizes, and the new unit can be built with components having the capacity to remove a requisite amount of heat at a faster rate so that it can be used in a wide variety of electronic apparatuses.

Briefly described, the invention includes a ventilation unit for operative arrangement within an electronic apparatus. This unit includes an exterior side having a first exhaust port separated from a second exhaust port, an adjacent interior side having first and second incoming passageways, and a first and second powered air mover; one powered air mover can be located closer to the exterior side than the other air mover. The first powered air mover can also be in communication with the first incoming passageway and the first exhaust port, and separated from the second powered air mover by use of a baffle extending generally from the exterior side around and between the two air movers.

Additional powered air movers can be accommodated, each with an additional exhaust port and incoming passageway as desired. An additional design feature that further distinguishes the ventilation unit of the invention from known side-by-side fan cooling system designs, is as follows: an inner width of the exterior side is preferably equal to or less than the sum of an outer dimension of the first powered air mover plus an outer dimension of the second powered air mover.

Also characterized herein, is a ventilation unit including an exterior side having first and second exhaust ports, an adjacent interior side having first and second incoming passageways, and a first and second powered air mover; wherein the first powered air mover in communication with both the first incoming passageway and the first exhaust port, yet separated from the second powered air mover which is in communication with both the second incoming passageway and second exhaust port.

The invention also includes a method of venting thermal energy generated within an electronic apparatus through an exterior side of a ventilation unit operating within the apparatus. This method comprises the steps of drawing air in through a first incoming passageway of an interior side of the unit and out a first exhaust port of the exterior side, separately from drawing air in through a second incoming passageway of the interior side and out a second exhaust port of the exterior side; the first incoming passageway can be located closer to the exterior side than the second incoming passageway. The operation of the first and second powered air movers can occur concurrently or independently.

BRIEF DESCRIPTION OF THE DRAWINGS

The invention will be more particularly described by referencing the accompanying drawings of the preferred embodiments, in which like numerals designate like parts.

DETAILED DESCRIPTION OF THE PREFERRED EMBODIMENTS

Figure 1:
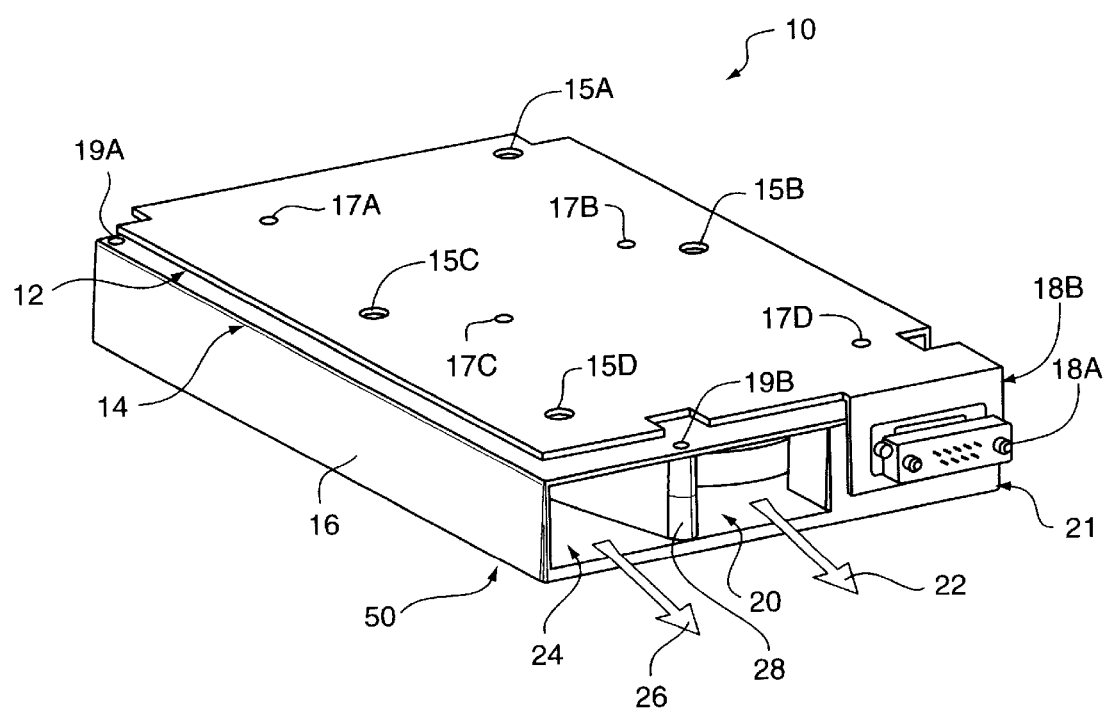
FIG. 1 is an isometric view of a preferred ventilation unit of the invention illustrating two exhaust ports in exterior side 21 and the direction of heat flow out of the unit.

The preferred compact ventilation unit 10 in FIG. 1, shows top lid 12 connected to middle lid 14 by way of four flat head screws 15a, 15b, 15c, 15d. That assembly of lids, in turn, is connected to bottom shell 16 by way of self-tapping screws 19a, 19b. The fastening means used to assemble the main components illustrated in FIG. 1 is not critical, any suitable fasteners such as bolts, screws, nails, hooks-and-loops (such as VELCRO®), and adhesives may be employed. The exterior side, shown at 21, of unit 10 has exhaust ports 20, 24 separated by wall 28 which could be any suitable baffle capable of separating the gas, such as air, flowing out of unit 10 as directed by arrows 22, 26. The fasteners shown at 17a, 17b, 17c, 17d will be described in more detail in connection with FIG. 4.

An electrical connector assembly 18a can be used to connect the unit to a source of power from either the electronic apparatus in which the unit 10 has been installed, or from some external source of power. To better control the flow of warm air when one or more of the powered air movers stops (see FIGS. 3–6), hot plugging or blind mate insertion may be accomplished via connector assembly 18a. Connector 18a may be located on unit 10 where space is conveniently available. Flap 18b helps hold it in place.

Figure 2:
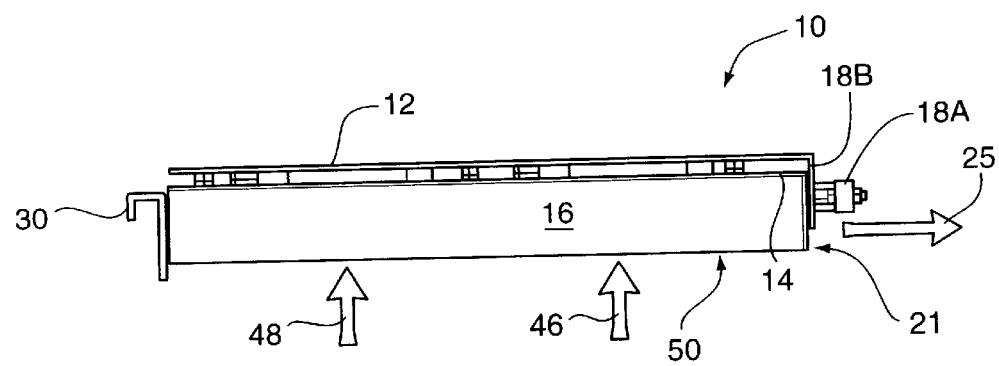
FIG. 2 is a side elevational view of the FIG. 1 unit showing the assembly of the top lid 12 and middle lid 14 to bottom shell 16.

The side elevational of FIG. 2 illustrates the connection of top lid 12 with middle lid 14, and also shows how that assembly of lids can be secured to bottom shell 16. One can see how connector flap 18b has been bent and formed as an integral part of top lid 12. Also shown is a positioning clip 30 for locking the unit 10 into place within an electronic device chassis, as necessary. This new unit 10 as designed, draws in warmed gas (such as air) through its interior side 50 (along arrows 46, 48) and then expels the air through exterior side 21 along the general direction of arrow 25. As unit 10 is oriented in FIG. 2, the interior side is found at the bottom of the unit. However, in operation within an electronic apparatus, the unit need only be oriented so that its interior side 50 is capable of drawing out heat generated within the electronic apparatus. The flow of thermal energy, or heat, through a preferred unit will be described in greater detail in connection with other Figures.

Figure 3:
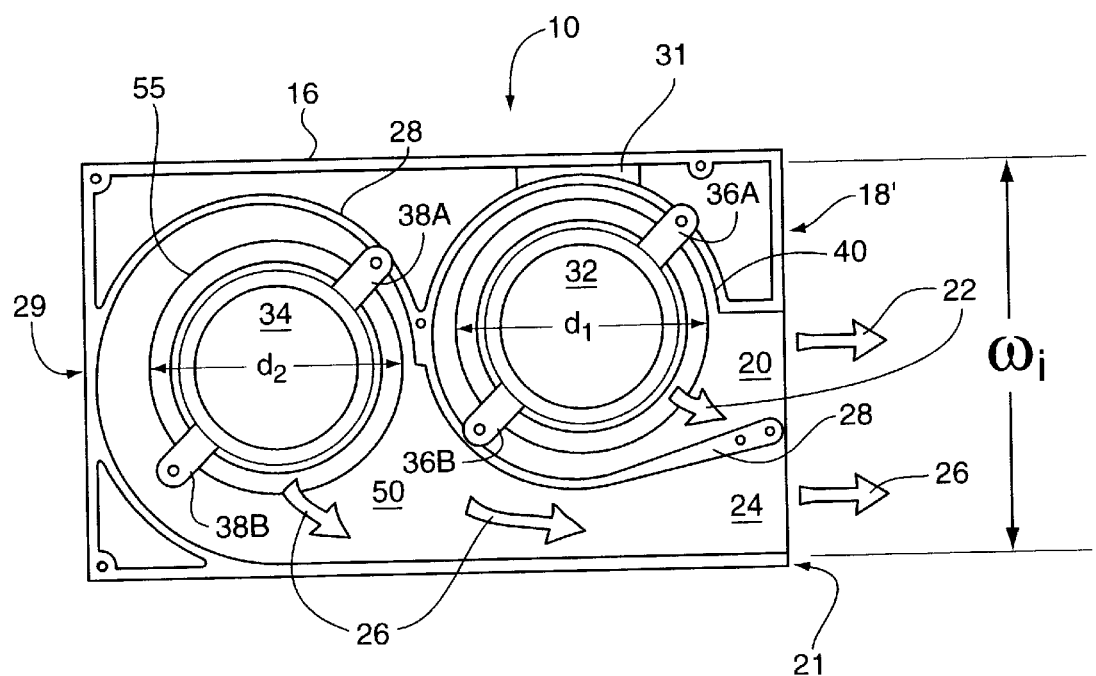
FIG. 3 is a top plan view of a preferred ventilation unit. Although both the top and middle lids are not included for simplicity, powered air mover assemblies 32, 34 have been included to illustrate their positioning within this preferred unit.

FIG. 3 further illustrates a preferred flow path of air up through interior side 50 then into and out of powered air mover assembly 32, and finally out exhaust port 20 (along arrows labeled 22). Likewise, air flows into and out of powered air mover assembly 34, and finally out exhaust port 24 (along arrows labeled 26). Powered air movers 32, 34 can be controlled to operate concurrently and/or independently, depending upon cooling requirements of the electronic device in which unit 10 has been installed. For example, a temperature sensor (not shown) connected to unit 10 to sense internal electronic device chassis temperature could send appropriate electronic signals via connector assembly 18a, or other suitable electrical connection with unit 10, to either one or both air movers to turn on (and/or off) as additional cooling is needed (or not). Furthermore, a system failure sensing mechanism may be included to signal whether one of the powered air movers has failed, so that one of the other powered air movers can be signaled to turn on, as necessary. Suitable simple temperature and system failure sensing mechanisms are known and available.

Also shown in FIG. 3 is a separation wall 28 that extends generally from exterior side 21 between air movers 32 and 34 and around to a point labeled 29 along the back side of unit 10. Wall 28 creates a baffle to generally separate the air flowing through and out of air mover 32 from air mover 34. A wall shown at 40, although not critical, provides a flow path for air exiting powered air mover 32 and out unit 10 through exhaust port 20. The space at 18' has been created to accommodate connector assembly 18a as positioned in FIG. 2. Member 31 operates to secure and support wall 40 within bottom shell 16.

Figure 4:
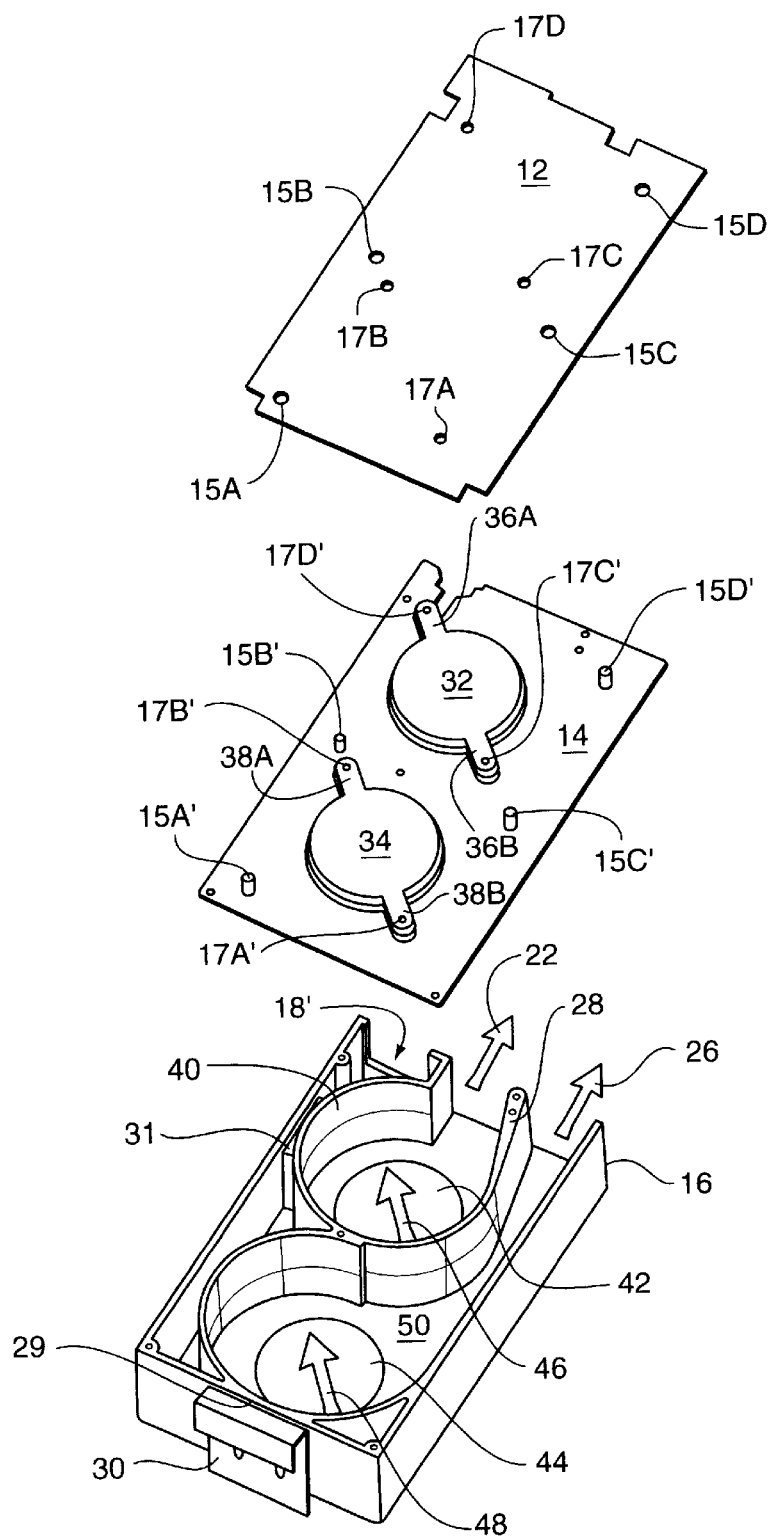
FIG. 4 shows top lid 12, middle lid 14, and bottom shell 16 in an exploded isometric view to better illustrate how powered air mover assemblies 32, 34 can be supported in a preferred ventilation unit.

Each powered air mover assembly 32, 34 shown in FIG. 3 has ears 36a, 36b and 38a, 38b respectively, for mounting between lids 12, 14 (see, also, FIG. 4). An outer dimension of air mover 32 is shown at $d_1$ and an outer dimension of air mover 34 is shown at $d_2$—the latter also representing an outer circumference 55 of travel for impeller fan blades (these are detailed at 54 in FIGS. 5 and 6). One can see that the inner width $w_i$ of exterior side 21 is equal to or less than the sum of $d_1$ and $d_2$; or more precisely as shown, $w_i$ is approximately equal to sum of $d_1$ and one-half of $d_2$. This is so because in unit 10, unlike known cooling systems with more than one fan, one powered air mover (labeled 32) is positioned closer to exterior side 21 than the other powered air mover (labeled 34). In known cooling systems, which have propeller fans positioned side by side so that warm air can be drawn in through and out the fan blades along the same direction, the exterior wall through which air is expelled must necessarily be quite a bit larger than the sum of the outer dimensions of each fan to provide adequate clearance for the rotating fan blades.

Turning to the isometric exploded view in FIG. 4 illustrating one way to assemble a preferred unit of the invention, the novel heat removal approach of a preferred unit can be better appreciated. Excess heat generated within an electronic apparatus is removed through passageways 42, 44 of interior side 50 along the direction of arrows labeled 46, 48, respectively, and out of the ventilation unit on either side of wall 28 along arrows labeled 22, 26, respectively. Middle lid 14 contains PEM stand-offs at 15a', 15b', 15c', 15d' that line up with 6-32 flat head screws at 15a, 15b, 15c, 15d in top lid 12 to secure the two lids together. Fasteners 17a, 17b, 17c, 17d align with holes 17a', 17b', 17c', 17d' in ears 36a, 36b, 38a, 38b to secure air movers 32, 34 between lids 12 and 14.

As one can see, unlike known computer cooling systems having propeller fans located side-by-side that pull air through their blades (oriented with axes of rotation perpendicular to the back wall of the computer's housing) and then expel this air straight out, the novel heat flow approach and compact design of the exterior side 21 of unit 10 allows it to be installed in an electronic apparatus without taking up a great deal of valuable chassis back wall real estate.

Figure 5:
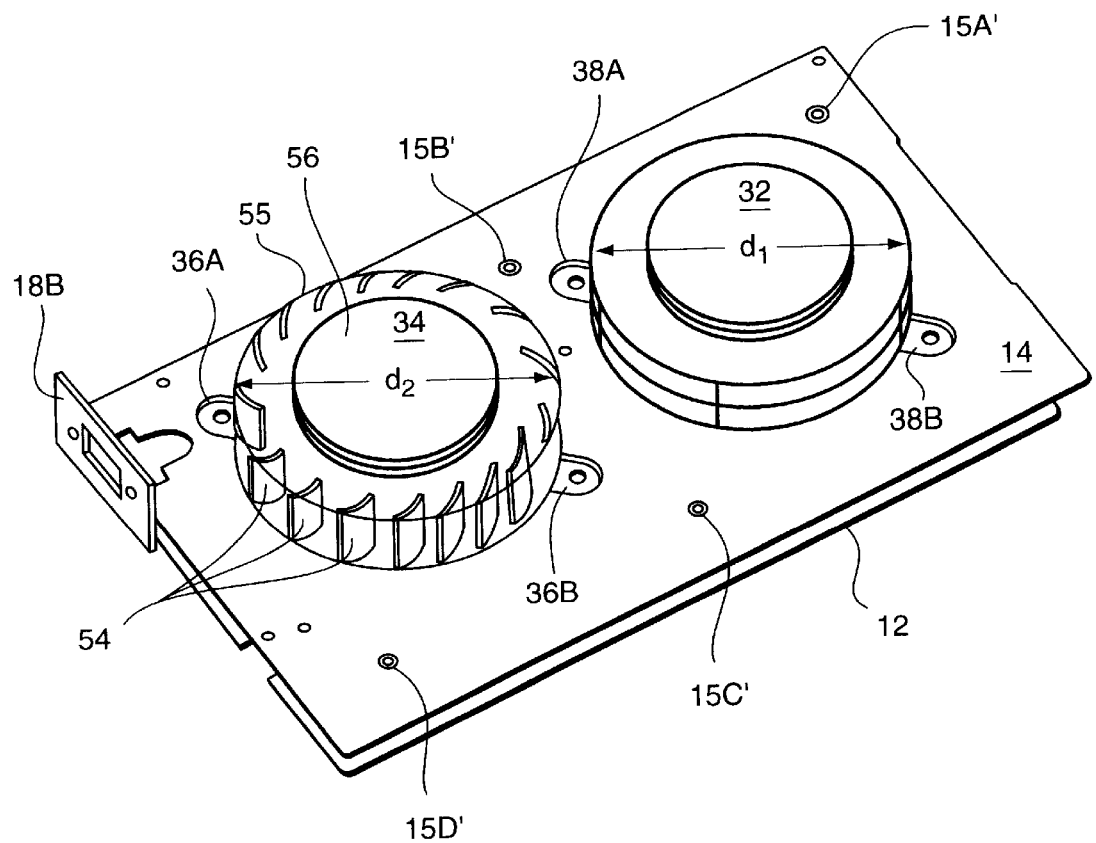
FIG. 5 illustrates the underside of an assembly of the top and middle lids 12, 14.
Figure 6:
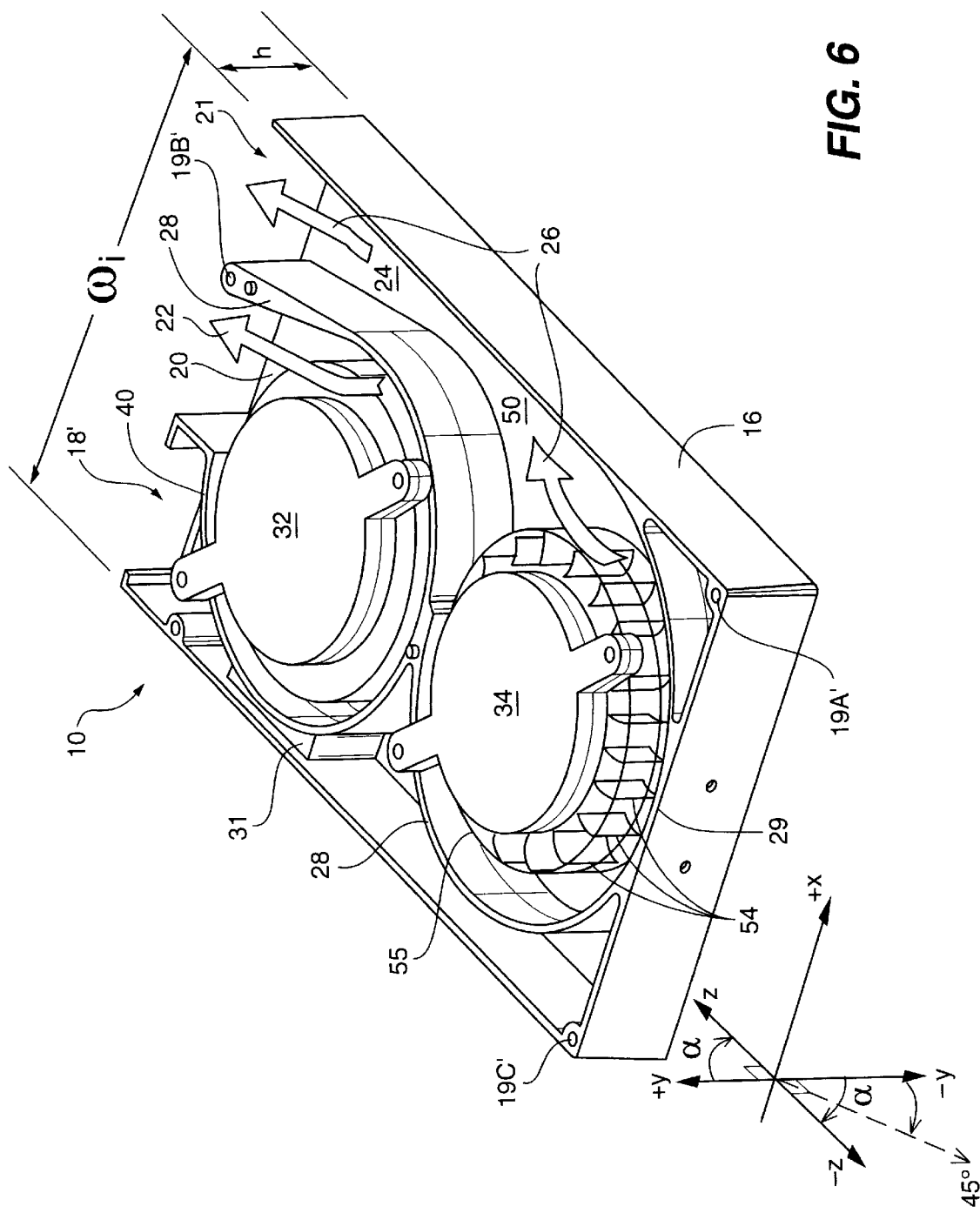
FIG. 6 is an isometric view of the FIG. 3 preferred unit which does not include either the top or middle lids, but does show the powered air mover assemblies 32, 34 to illustrate their positioning within the unit.

If one were to flip the assembly of the top and middle lids (12, 14) over, the view in FIG. 5 would appear. Again, one can see connector assembly flap 18b has been formed in top lid 12. Although not limited as such, the two powered air movers 32, 34 could be radial impeller fans, each having an outer diameter $d_1$ and $d_2$. As detailed for powered air mover 34 in FIGS. 5 and 6, impeller blades 54 rotate around an axis oriented generally perpendicular to interior side (labeled 50 in FIG. 6)—the outer circumference of travel of blades 54 has been labeled 55 for reference. In the event a radial impeller fan is also used with a suitable motor for powered air mover 32, it could, likewise, have similarly oriented impeller fan blades. By way of example only, one suitable radial impeller fan and motor subassembly is that from the BISCUIT® DC Brushless DC Blower distributed by Comair Rotron—the BISCUIT® impeller is made of black polypropylene and its motor runs off a DC (direct current) source. Powered air movers, as that term is used herein, includes a wide variety of mechanical devices capable of moving warmed gas, such as air through a unit of the invention: radial, centrifugal, and screw impeller fans; reciprocating blade fans; and other suitable blower mechanisms. Fan blades can be made of metal alloys, hi-impact lightweight plastics, and other suitable durable materials. Many types of suitable, sufficiently reliable fan and blower motors are available that can provide requisite power (whether driven off an AC or DC source). Suitable materials for lids 12, 14 include lightweight metal alloys, durable plastics with sufficient strength to support and withstand vibration of the powered air movers in operation, and other similar materials able to withstand internal temperatures of electronic apparatuses into which the unit is installed.

Turning to the isometric of FIG. 6, one can again view the flow of heat as it is being removed from an electronic apparatus through passageways (located under air movers 32, 34) of interior side 50, upward and out of powered air movers 32, 34, and then out of exhaust ports 20, 24 of unit 10 on either side of wall 28 along arrows labeled 22, 26, respectively. Holes 19a', 19b', 19c' accept self tapping 6-32 screws to connect middle lid (14 in FIG. 4) to bottom shell 16. Although bottom shell 16 is shown rectangular in shape, it need not be: its walls could be curved to aid in producing less turbulent flow of warm air throughout unit 10. For example, shell 16 could be designed as a tear-drop in shape. The design of a bottom shell will be driven by available chassis space, as well as ease of replacement and mounting specifications within a chassis. Suitable materials for shell 16 include lightweight metal alloys, durable plastics with sufficient strength to support and withstand vibration of the powered air movers in operation, and other similar materials able to withstand internal chassis temperatures.

A powered air mover incorporated into unit 10 need not be oriented as shown, but may instead be mounted with its axis of rotation angled at "α" up to 90 degrees from either "y" or "–y" direction as the case may be, which runs along the perpendicular to interior side 50. The specific angle of powered air movers is not critical, however, preferably heat should flow in through an interior side (such as that at 50) and out an adjacent side (such as that at 21) of a preferred unit. As one can imagine, for example, mounting a powered air mover with its axis of rotation oriented at an angle α equal to 45 degrees from the –y direction as shown, would increase the height "h" of exterior side 21 without requiring a corresponding increase in inner width $w_i$. If the powered air mover axis of rotation α is oriented at 90 degrees from the –y direction, height h would necessarily be greater than an outer diameter of the powered air mover to provide clearance for the air mover in operation. By way of example as shown, a radial impeller fan (having blades shown at 54) with its axis of rotation oriented along the –y direction will be most efficient at removing warm air from the inside of an electronic apparatus. As the orientation of a radial impeller fan axis of rotation moves from the –y direction to an angle α equal to 90 degrees from –y direction, the fan will become less efficient at removing thermal energy from a chassis.

The location of exhaust ports 20, 24 relative to each other is not critical. Although unit 10 is shown with baffle 28 located to the right-hand side of powered air mover 32, exhaust port 24 could alternatively be located to the left of air mover 32. Although not critical, the centers of powered air movers are not aligned along a straight line running parallel to the walls of bottom shell 16, but instead have been offset slightly to aid in less restrictive flow along arrows 26. Note however that, as this offset is made larger (which will move air mover 34 toward the lower right-hand corner of FIG. 6, and thus further from air mover 32), inner width $w_i$ will become larger. Wall 40 could be removed in the event no space 18' is needed along exterior side 21 to accommodate a connector.

Additional powered air movers may be added to a preferred unit 10. Preferably, the point labeled 29 of the back side of shell 16 would be pushed out toward the lower left-hand corner of FIG. 6 to locate an additional air mover. A baffle would preferably be added to separate air exiting powered air mover 34 from that exiting the additional air mover. The additional baffle could extend along either the right-hand or left-hand side of powered air mover 32. Similarly, a fourth powered air mover could be added, and so on.

Figure 7:
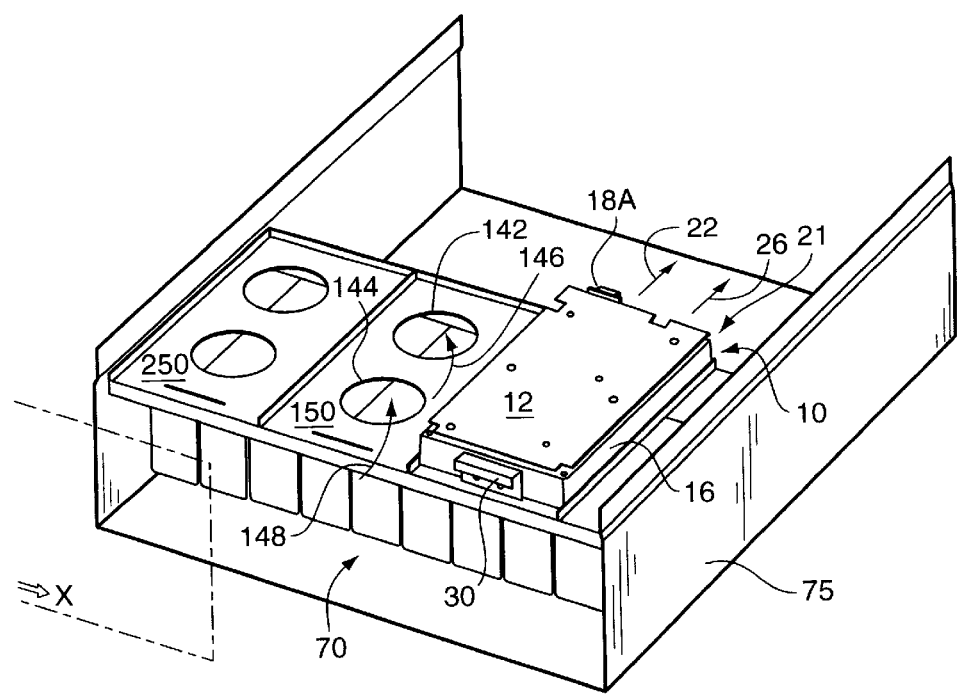
FIGS. 7 and 8 are isometric views of alternative ways to position and mount a ventilation unit of the invention within an electronic apparatus chassis; the chassis shown could be that from an apparatus such as a personal computer (PC), workstation, mainframe, fax machine, copier, scanner, or other computerized and/or electronic device.

FIG. 7 illustrates a portion of an electronic device chassis 75 in which a preferred unit 10 has been mounted, by way of example only, above a redundant array of independent disks (RAID) subsystem labeled 70. A RAID subsystem typically includes a plurality of disk drives and a controller that provide redundant (or back-up) operation in the event of failure of any one of the disk components. One can increase the overall reliability of a RAID subsystem with adequate, reliable ventilation such as that provided by preferred unit 10. Several units, similar to the unit shown at 10, may be aligned side by side, as necessary, to provide adequate ventilation to a RAID. For simplicity, one full unit 10 is shown in FIG. 7 while only the interior sides 150, 250 of two additional units have been illustrated. As shown, heat generated from assembly 70 is drawn up through passageways 142, 144 of interior side 150 along arrows 146, 148. Heat flowing into unit 10 is removed out exterior side 21 along arrows 22, 26. Again, connector 18a and mounting hook 30 are seen in this FIG. 1t is not critical that a unit of the invention be oriented as shown in an apparatus chassis.

Figure 8:
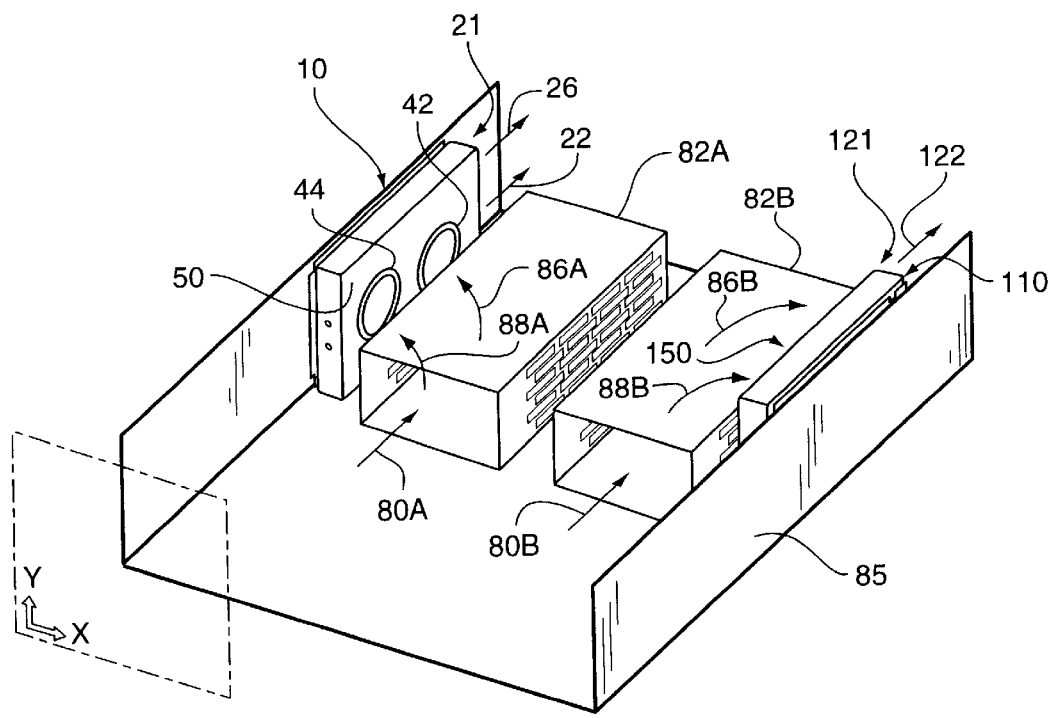

FIG. 8 illustrates the design flexibility of the invention as mounted in yet another electronic apparatus chassis 85. As mentioned earlier, the chassis shown could be that from an apparatus such as a personal computer (PC), workstation, mainframe, fax machine, copier, scanner, or other computerized and/or electronic device. Here, two units 10, 110 have been mounted along the side walls of chassis 85 to draw air along arrows 80a, 80b into subassembly housings 82a, 82b. As can be seen with unit 10, air flows in through passageways 42, 44 of interior side 50 along arrows 86a, 88a, and out exterior side 21 along arrows 22, 26. Likewise, heat flows into unit 110 through interior side 150 along arrows 86b, 88b and out exterior side 121 along arrow 122.

By way of example only, representative dimensions of one unit produced with approximate outer rectangular dimensions of 8½ inches in length, by 5 inches by 1¼ inch are as follows: the outer diameters $d_1$ and $d_2$ of two radial impeller fans oriented with their axes of rotation in the −y direction (see FIG. 6) were approximately 3 inches; the diameters of passageways 42, 44 were approximately 2⅜ inches. As explained earlier, the sizes of powered air movers 32, 34 and incoming passageways 42, 44 need not be the same. And it will be appreciated that if additional powered air movers are added and/or the orientation of powered air movers is modified, the outer dimensions of the ventilation unit of the invention will increase.

While certain representative embodiments and details have been shown for the purpose of illustrating the invention, those skilled in the art will readily appreciate that various modifications may be made to the invention without departing from the novel teachings or scope of this invention. Accordingly, all such modifications are intended to be included within the scope of this invention as defined in the following claims. In the claims, any means-plus-function clauses used are intended to cover the structures described herein as performing the recited function and not only structural equivalents but also equivalent structures.

What is claimed is:

1. A ventilation unit for operative arrangement within an electronic apparatus, the unit comprising:

an exterior side having a first exhaust port separated from a second exhaust port, an adjacent interior side having first and second incoming passageways, and a back side;

a first powered air mover located generally in the same plane as, and located closer to said exterior side than, a second powered air mover; and said first exhaust port and said first powered air mover are separated from said second exhaust port and said second powered air mover by a baffle extending generally from said exterior side and toward said back side.

2. The unit of claim 1 wherein said second powered air mover comprises a propeller fan having its axis of rotation oriented generally along a perpendicular to said adjacent interior side, to draw air in through said second incoming passageway generally along said perpendicular and out said second exhaust port in a flow direction generally parallel to said adjacent interior side.

3. The unit of claim 2 further comprising a side wall extending at least partially along said adjacent interior side; and wherein an offset difference between the distance from said central point of said second powered air mover to said side wall, and the distance from a central point of said first powered air mover to said side wall, is less than an outer dimension of said first powered air mover.

4. The unit of claim 1 wherein said first powered air mover is in communication with both said first incoming passageway and said first exhaust port, and separated from said second powered air mover which is in communication with both said second incoming passageway and said second exhaust port.

5. The unit of claim 1 wherein an inner width of said exterior side is equal to or less than the sum of an outer dimension of said first powered air mover plus an outer dimension of said second powered air mover.

6. The unit of claim 5 wherein said outer dimension of said first powered air mover is substantially equal to said outer dimension of said second powered air mover.

7. The unit of claim 1 wherein an inner width of said exterior side is equal to or less than the sum of an outer dimension of said first powered air mover plus three-fourths of an outer dimension of said second powered air mover.

8. The unit of claim 7 wherein said outer dimension of said first powered air mover is greater than the dimension of said second powered air mover.

9. The unit of claim 1 further comprising a side wall extending at least partially along said adjacent interior side; and wherein;

a central point of said second powered air mover is located a distance from said exterior side that is equal to or greater than an outer dimension of said first powered air mover; and an offset difference between the distance from said central point of said second powered air mover to said side wall, and the distance from a central point of said first powered air mover to said side wall, is less than said outer dimension of said first powered air mover.

10. The unit of claim 9 wherein said first powered air mover comprises a radial impeller fan to draw air in through said first incoming passageway and out said first exhaust port.

11. The unit of claim 9 wherein said second powered air mover comprises a propeller fan having its axis of rotation at an angle that is oriented less than 90 degrees from an outwardly extending perpendicular to said adjacent interior side, to draw air in through said second incoming passageway generally along said angle and out said second exhaust port in a flow direction generally along said adjacent interior side.

12. The unit of claim 9 further comprising a back side having a lock mechanism to secure the unit within the apparatus; and wherein said exterior side further comprises an electrical connector.

13. The unit of claim 1:
wherein said baffle comprises a wall having a first arc oriented generally around said first powered air mover connected to a second arc oriented generally around said second powered air mover.

14. The unit of claim 13 wherein an inner width of said exterior side is equal to or less than the sum of an outer dimension of said first powered air mover plus three-fourths of an outer dimension of said second powered air mover.

15. A ventilation unit for operative arrangement within an electronic apparatus, the unit comprising:
an exterior side having first and second exhaust ports, an adjacent interior bottom side having first and second incoming passageways, and a side wall extending generally along said adjacent interior bottom side toward a back side of the unit;
a first powered air mover located generally in the same plane as, and located closer to said exterior side and closer to said side wall than, a second powered air mover; and
said first powered air mover in communication with both said first incoming passageway and said first exhaust port, and separated from said second powered air mover which is in communication with both said second incoming passageway and said second exhaust port.

16. The unit of claim 15 wherein said first and second exhaust ports are separated by a baffle extending generally from said exterior side and between said first and second powered air movers and to said back side.

17. The unit of claim 16 wherein an inner width of said exterior side is equal to or less than the sum of an outer dimension of said first powered air mover plus an outer dimension of said second powered air mover.

18. The unit of claim 15 wherein a central point of said second powered air mover is located a distance from said exterior side, greater than an outer dimension of said first powered air mover; and an offset difference between the distance from said central point of said second powered air mover to said side wall, and the distance from a central point of said first powered air mover to said side wall, is less than said outer dimension of said first powered air mover.

19. The unit of claim 15 wherein:
said first powered air mover comprises a radial impeller fan to draw air in through said first incoming passageway and out said first exhaust port; and an inner width of said exterior side is less than the sum of an outer dimension of said first powered air mover plus three-fourths of an outer dimension of said second powered air mover.

20. The unit of claim 15 wherein the apparatus is a computerized device and said first and second powered air movers operate concurrently to expel air through said exhaust ports.

21. The unit of claim 15 further comprising a temperature sensor and wherein said first and second powered air movers operate independently and concurrently to expel air through said exhaust ports as needed.

22. A method of venting thermal energy generated within an electronic apparatus through an exterior side of a ventilation unit operating within the apparatus, comprising the steps of drawing air in through a first incoming passageway from an interior bottom side of the unit and out a first exhaust port of the exterior side, separately from drawing air in through a second incoming passageway from said interior bottom side, said second incoming passageway located further from said exterior side than, generally in the same plane as, and at least partially behind, said first incoming passageway; said air drawn in through said second incoming passageway, then, being directed by a baffle extending between said first and second passageways and out a second exhaust port of said exterior side.

23. The method of claim 22 wherein said baffle comprises a wall having a first arc oriented generally around said first incoming passageway connected to a second arc oriented generally around said second incoming passageway.

24. The method of claim 22 wherein said step of drawing air in through said first incoming passageway further comprises operating a first radial impeller fan, and said step of drawing air in through a second incoming passageway further comprises operating a second radial impeller fan.

25. The method of claim 24 wherein said steps of operating said first radial impeller fan and operating said second radial impeller fan, occur concurrently.

26. The method of claim 24 further comprising the steps of sensing the temperature within the electronic apparatus and said steps of operating said first radial impeller fan and operating said second radial impeller fan, occur independently.

27. The method of claim 22 wherein:
said step of drawing air in through said first incoming passageway further comprises operating a first powered air mover, and said step of drawing air in through a second incoming passageway further comprises operating a second powered air mover;
a central point of said second powered air mover is located a distance from said exterior side that is equal to or greater than an outer dimension of said first powered air mover; and
an offset difference between the distance from said central point of said second powered air mover to a side wall extending at least partially along said interior side, and the distance from a central point of said first powered air mover to said side wall, is less than said outer dimension of said first powered air mover.

* * * * *